United States Patent
Kitagawa

(10) Patent No.: US 8,743,588 B2
(45) Date of Patent: Jun. 3, 2014

(54) RESISTANCE-CHANGE MEMORY DEVICE AND METHOD OF OPERATING THE SAME

(75) Inventor: Makoto Kitagawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 63 days.

(21) Appl. No.: 13/489,916

(22) Filed: Jun. 6, 2012

(65) Prior Publication Data

US 2012/0320659 A1    Dec. 20, 2012

(30) Foreign Application Priority Data

Jun. 14, 2011    (JP) .................................. 2011-132576

(51) Int. Cl.
*G11C 11/00*    (2006.01)

(52) U.S. Cl.
USPC .......................................... 365/148; 365/163

(58) Field of Classification Search
USPC .................................................. 365/148, 163
See application file for complete search history.

(56) References Cited

U.S. PATENT DOCUMENTS

2012/0099367 A1*    4/2012    Azuma et al. .................. 365/148

FOREIGN PATENT DOCUMENTS

| JP | 2010-170617 | 8/2010 |
| WO | 2007-015358 | 2/2007 |

OTHER PUBLICATIONS

K. Aratani et al.; A Novel Resistance Memory with High Scalability and Nanosecond Switching; Technical Digest IEDM; 2007; pp. 783-786.

* cited by examiner

*Primary Examiner* — Huan Hoang
(74) *Attorney, Agent, or Firm* — Dentons US LLP

(57) ABSTRACT

Disclosed herein is a resistance-change memory device including a bit line; a voltage supplying layer; a memory element connected between the bit line and the voltage supplying layer, a resistance value of the memory element being changed in accordance with an applied voltage; and a drive controlling circuit causing a first current to flow through the bit line and causing a second current smaller than the first current to flow through the bit line, thereby controlling a resistance decreasing operation in which the memory element is made to transit from a high resistance state to a low resistance state by using the second current.

9 Claims, 12 Drawing Sheets

F I G . 3
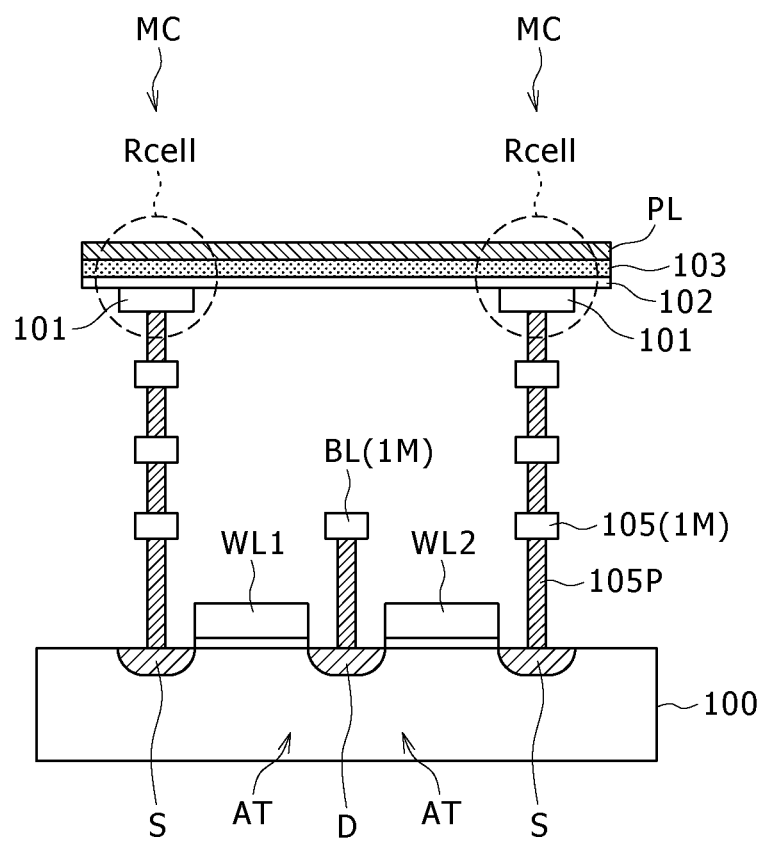

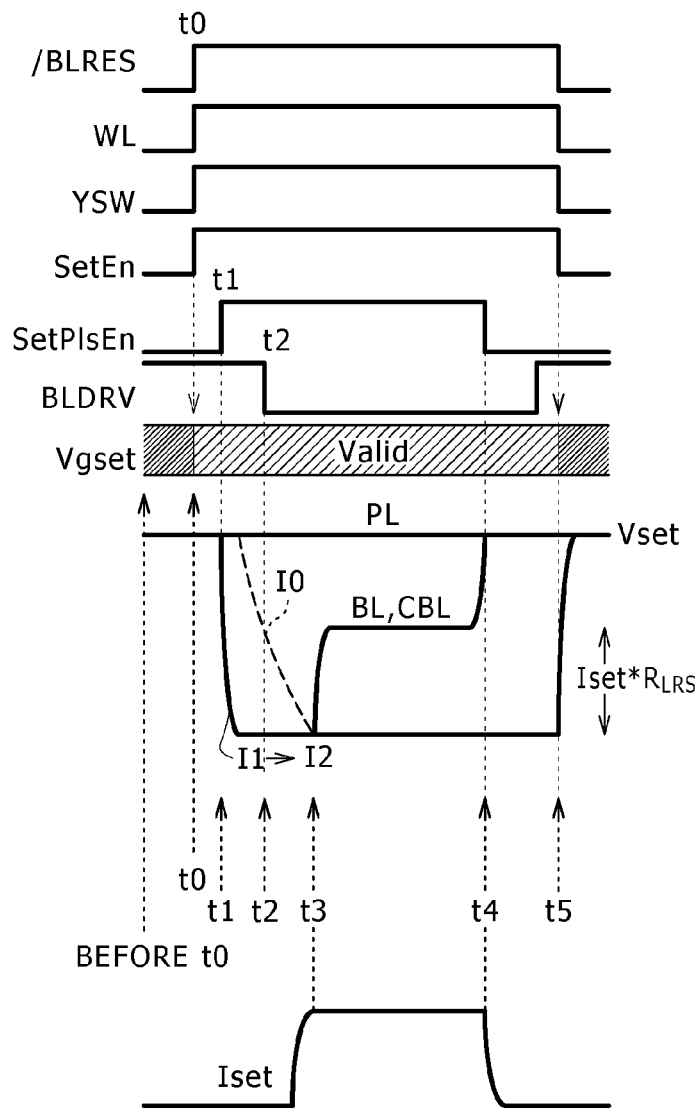

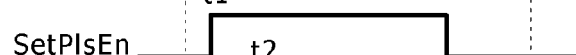
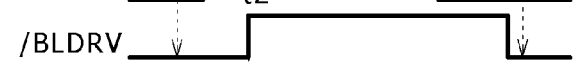
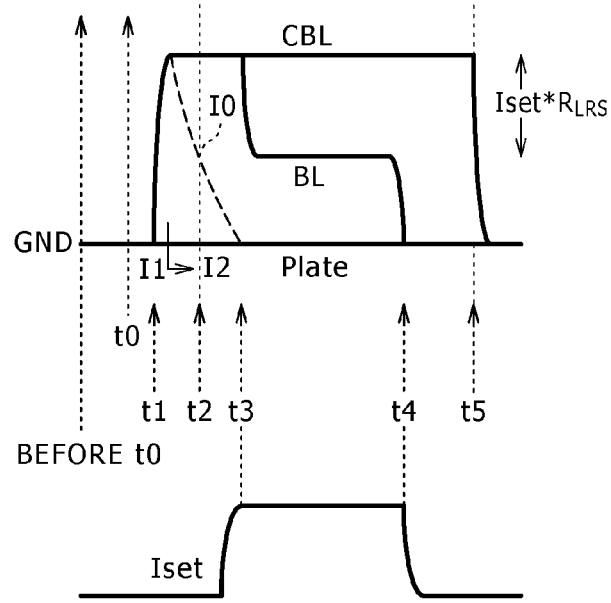

RESISTANCE-CHANGE MEMORY DEVICE AND METHOD OF OPERATING THE SAME

BACKGROUND

The present disclosure relates to a resistance-change memory device in which a memory element whose resistance value is changed in accordance with an applied voltage is connected between a bit line and either a source line or a voltage supplying layer called a plate, and relates to a method of operating the same.

A resistance-change memory device is known which has a memory element whose resistance value is changed either by implanting conductive ions into an insulating film or by drawing out conductive ions from an insulating film every memory cell. The resistance-change memory device, for example, is disclosed in Non-Patent Document of K. Aratani, K. Ohba, T. Mizuguchi, S. Yasuda, T. Shiimoto, T. Tsushima, T. Sone, K. Endo, A. Kouchiyama, S. Sasaki, A. Maesaka, N. Yamada, and H. Narisawa: "A Novel Resistance Memory with High Scalability and Nanosecond Switching," Technical Digest IEDM 2007, pp. 783 to 786.

The memory element has a lamination structure in which the layer, described above, for supplying the conductive ions and insulating films are formed between two electrodes. A memory cell is configured in such a way that the memory element and an access transistor is connected in series between the bit line and the plate so as to enable active matrix driving to be carried out.

Such a memory cell is a sort of memory utilizing a 1T1R type current drive system because it includes one transistor (T) and one (variable) resistor (R). The memory using the conductive ions is generally called a ReRAM together with a memory using oxidation and reduction of an insulating layer.

In the ReRAM, small and large of the resistance value are made to correspond to write and erasure of data, respectively, and a writing operation and an erasing operation can be carried out by using a pulse having a short duration on the order of nanoseconds. For this reason, the ReRAM gets a lot of attention as a non-volatile memory (NVM) which can carry out a high-speed operation like a random access memory (RAM).

FIG. 1 shows a diagram of correlation between a conductance and a current in a low-resistance state of the ReRAM using conductive ions.

An axis of abscissa in FIG. 1 represents a reciprocal number (conductance) of a resistance value RLRS in a low-resistance state (LRS). In addition, an axis of ordinate in FIG. 1 represents a value of a set current (Iset) in a resistance decreasing operation (referred to as "a set operation" in this case).

As apparent from FIG. 1, the resistance value of the memory element is approximately, linearly changed in accordance with the set current. Such characteristics can be realized similarly even in any other suitable resistance-change memory such as the ReRAM.

From the foregoing, the ReRAM has an advantage that the current control is precisely carried out, thereby narrowing a resistance value distribution, or a multi-valued memory can be realized.

However, the ReRAM also has a disadvantage that when the precision of the current control is low, a desired resistance value is hard to obtain and especially, excessive current application results in that a resistance increasing (reset) operation is hard to carry out, or repetitive characteristics are reduced.

A system for regulating an element current in accordance with gate electric potential control (word line control) of an access transistor, and a system for controlling a current of a bit line are known as a system for carrying out the control for the element current.

In particular, since the word line is made of a gate metal and thus includes a large number of gate capacitances as parasitic capacitances, the word line is hard to control because of a large wiring capacitance thereof. Therefore, high-speed driving is difficult for the word line. In addition, when a high-speed operation is attempted to be carried out, since it is necessary to increase a driving force of a control circuit for the word line, it is feared to cause an increase in cost due to an increase in a circuit area.

On the other hand, since the bit line is composed of an upper layer wiring layer and has a relatively small wiring capacitance, the bit line is easy to control. Therefore, the high-speed operation can be carried out with the current control system using the bit line. In addition, with the current control for the bit line, it is possible to suppress the circuit area and it is possible to save the cost from this viewpoint. Therefore, the adoption of the current control system for the bit line results in that the cost saving and the high-speed operation can be made compatible with each other.

With the system for regulating the element current in accordance with the current control for the bit line, in addition to the bit lines and the word lines, source lines also need to be separated in a row direction, thereby enabling the electric potential driving to be carried out. In that context, the system (or the access system) to which the current control method concerned is applied is called a three-wire system.

With regard to the current control for the bit line based on the three-wire system, the inventor of this application previously made several proposals. One of the techniques disclosed in such proposals, for example, is described in Japanese Patent Laid-Open No. 2010-170617. In addition, an example in which the current control system is applied to a resistance-change memory utilizing a spin implantation system, for example, is disclosed in domestic re-publication of PCT international publication for patent application WO2007/015358.

It is noted that a resistance memory disclosed in Non-Patent Document 1 has an array structure in which for processing easiness, an upper electrode is processed into a plate-like shape, a drain of an access transistor is used as a memory node, and a source is connected to a bit line processed into a line-like shape. This array structure adopts a system (two-wire system) in which one memory cell is selected by two wires of the bit line and the word line.

SUMMARY

With the system for carrying out the current control described in Japanese Patent Laid-Open No. 2010-170617, for example, a drain of a current controlled transistor (NMOS transistor) is connected to a bit line, and a gate voltage at a gate of the current controlled transistor is controlled by a control circuit. With this control, in and after inversion to a decreased resistance state of a memory element, a control circuit controls a current control transistor, whereby an electric potential of a bit line is controlled in such a way that an access transistor is operated in a saturated region, and an element current becomes constant. For this reason, even when a resistance value of the memory element is changed or even when a dispersion of the memory elements exists, a set current (the element current in and after the inversion) becomes constant, and thus an excessive current is prevented from being caused to flow. Therefore, the reduction of the element characteristics is effectively prevented or suppressed.

However, in the two-wire system memory in which the processing easiness is regarded as important as with Non-Patent Document 1, since it is difficult to perform the current control for the plate, application of the current control system described above to a bit line is desired. In addition, even with a three-wire system having source lines which are separated from one another every memory cell column instead of having the plate, the current control system is applied to the bit line for some reason in some cases.

By application of the current control system, it is possible to suppress the dispersion of resistance value distributions after a change of the resistance value. In addition, this system has an advantage that since a driving ability may be lower than that in the word line control system, an area occupied by the control circuit is small and thus the cost saving is realized.

More specifically, in a resistance decreasing operation of the memory element, in a state in which an electric potential of either the plate or the source line is fixed to a given electric potential, the voltage is applied in order to cause the element current to flow through the memory element by changing an electric potential of the bit line from the given electric potential concerned.

However, the current caused to flow through the bit line is regulated because an excessive current is prevented from being applied to the memory element. Therefore, it is difficult to abruptly change the electric potential of the bit line. For this reason, since the wiring capacitance of the bit line is smaller than that of the word line, the operation speed which ought to be generally made high may not to be sufficiently made high.

The present disclosure has been made in order to solve the problems described above, and it is therefore desirable to provide a resistance-change memory device which is capable of starting a resistance decreasing operation by changing an electric potential of a bit line, thereby carrying out current control for the bit line with an enhanced high-speed property, and a method of operating the same.

According to an embodiment of the present disclosure, there is provided a resistance-change memory device including: a bit line; a voltage supplying layer; a memory element connected between the bit line and the voltage supplying layer, a resistance value of the memory element being changed in accordance with an applied voltage; and a drive controlling circuit causing a first current to flow through the bit line and causing a second current smaller than the first current to flow through the bit line, thereby controlling a resistance decreasing operation in which the memory element is made to transit from a high resistance state to a low resistance state by using the second current.

According to another embodiment of the present disclosure, there is provided a method of operating a resistance-change memory device, including: causing a first current to flow through a bit line during resistance decreasing operation in which a memory element which is connected between the bit line and a voltage supplying layer and whose resistance value is changed in accordance with an applied voltage is made to transit from a high resistance state to a low resistance state; and causing a second current smaller than the first current to flow through the bit line, thereby controlling the resistance decreasing operation of the memory element.

According to the constitution of the present disclosure described above, at the beginning of the operation for decreasing the resistance, the bit line is driven with the larger first current. The first current is continuously caused to flow through the bit line with this state being kept up, which results in that the excessive current is applied to the memory element described above. For this reason, in this technique, the current caused to flow through the bit line is switched from the first current over to the smaller second current. Also, the element current caused to flow through the memory element is controlled by using the second current caused to flow through the bit line. Therefore, for example, even when the dispersion is caused in the memory elements, the electric potential of the bit line is controlled in such a way that the desired current is caused to flow through the bit line.

When the technique disclosed in the present disclosure is not applied, the current caused to flow through the bit line is controlled without switching the current. Therefore, the current has a current value which is suppressed to a certain extent, and thus it takes a time for the electric potential of the bit line to change.

On the other hand, with this technique, at the beginning of the operation, the rapid change of the electric potential of the bit line is carried out by using the first current, and the final current control is carried out by using the smaller second current. The current stress applied to the memory element, for example, depends on the current values of the first current and the second current, and the times during which the first current and the second current flow, respectively. However, the current control is carried out in order to absorb the element dispersion, thereby obtaining the desired resistance value, and thus this can be sufficiently obtained by the final control for the second current. With this technique, since in addition to the maintaining of the high controllability, the electric potential of the bit line is rapidly changed at the beginning of the operation, the total time during which the current is applied is shortened.

As set forth hereinabove, according to the embodiments of the present disclosure, the high-speed operation is further enhanced in the resistance-change memory device which starts the operation for decreasing the resistance by changing the electric potential of the bit line, thereby carrying out the current control for the bit line, and the method of operating the same.

BRIEF DESCRIPTION OF THE DRAWINGS

FIG. 3 is a schematic view showing a device structure of two memory cells adjacent to each other;

FIGS. 6A to 6I are respectively waveform charts explaining an operation of the column circuit configuration in the resistance-change memory device according to First Embodiment of the present disclosure;

FIGS. 11A to 11I are respectively waveform charts explaining an operation of the column circuit configuration in the resistance-change memory device according to Third Embodiment of the present disclosure.

DETAILED DESCRIPTION OF THE PREFERRED EMBODIMENTS

Embodiments of the present disclosure will be described in detail hereinafter by exemplifying a memory device whose resistance is changed in accordance with a movement of conductive ions with reference to the accompanying drawings.

It is noted that the description will be given below in accordance with the following order.

1. First Embodiment: The case where start of an operation for decreasing a resistance is carried out by reducing an electric potential of a bit line, thereby drawing out a current from the bit line. A configuration is disclosed in which a current caused to flow through the bit line is switched from a first current over to a second current at start of the operation for decreasing the resistance by using two transistors connected in parallel with each other.

2. Second Embodiment: The case where when the bit line current is drawn out similarly to the case of First Embodiment, switching of currents is carried out by using one transistor.

3. Third Embodiment: The case where start of an operation for decreasing a resistance is carried out by increasing an electric potential of a bit line, thereby supplying a current to the bit line.

4. Fourth Embodiment: The case where a P-channel transistor is used as an access transistor.

5. Modified Changes.

1. First Embodiment

[Configuration of Memory Cell]

Figure 1:
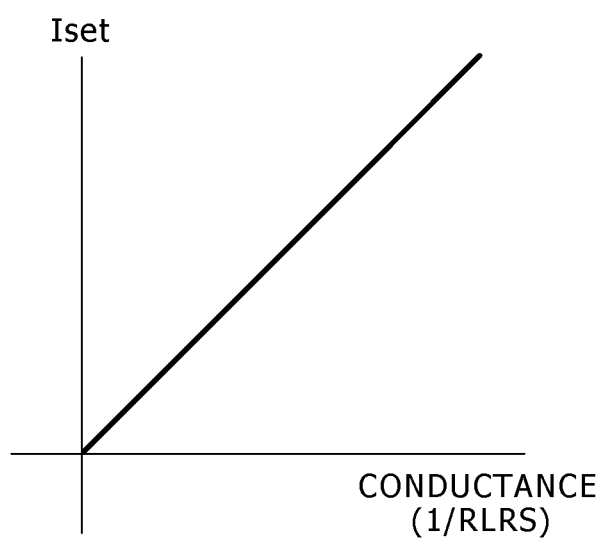
FIG. 1 is a diagram showing a correlation between a conductance and a current in a low-resistance state of a ReRAM using conductive ions.
Figure 2A:
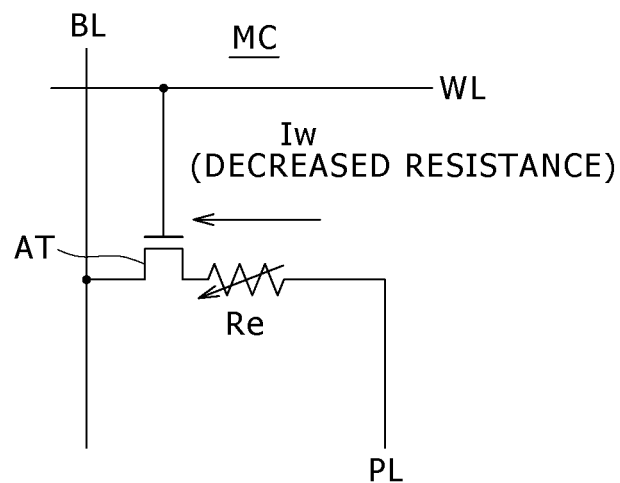
FIGS. 2A and 2B are respectively an equivalent circuit diagram of a memory cell in the case of a write current, and an equivalent circuit diagram of the memory cell in the case of an erasing current.
Figure 2B:
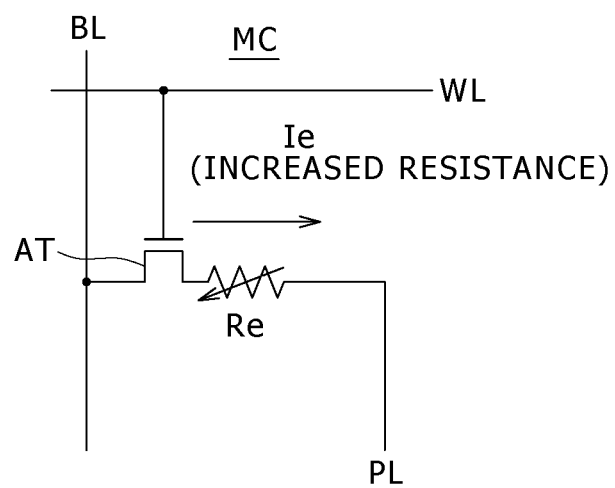

FIGS. 2A and 2B respectively show equivalent circuit diagrams of a memory cell common to Embodiments of the present disclosure. Note that, although FIG. 2A shows a direction of a write current, and FIG. 2B shows a direction of an erasing current, a memory cell configuration itself is common to both of FIGS. 2A and 2B.

A memory cell MC illustrated in FIGS. 2A and 2B includes one variable resistive element Re as "a memory element," and one access transistor AT.

One terminal of the variable resistive element Re is connected to a plate PL, and the other terminal thereof is connected to a source terminal of the access transistor AT. Also, a drain terminal of the access transistor AT is connected to a bit line BL, and a gate electrode thereof is connected to a word line WL. Here, the plate PL is an example of "a voltage supplying layer." Also, the plate PL may be a plate-like conductive layer common to a memory cell array. Or, the plate PL may also be a lattice-like wiring which is disposed two-dimensionally (in a row direction and in a column direction in cell disposition of the memory cell array), and through which plural memory cells composing the memory array are commonly connected to one another.

It is noted that the case where "the voltage supplying layer" is a wiring is also possible. "The wiring" in this case means a wiring which is commonly connected to plural memory cells composing either one row or one column in the cell disposition of the memory cell array.

First Embodiment is more suitable for a two-wire system in which such a memory cell is connected to two lines of the bit line BL and the word line WL in such a way. Here, although the word line WL is used to control the access transistor AT, a target to be controlled is not limited to the transistor, and thus any other suitable element may be available as long as it is a section for selecting the memory cells.

FIG. 3 shows a device structure of a portion corresponding to two memory cells MC adjacent to each other. FIG. 3 is a schematic cross sectional view, and no slant line is added thereto. In addition, a blank portion in FIG. 3 which is not especially mentioned is filled with an insulating film or composes a part of other constituent elements.

In the memory cells MC illustrated in FIG. 3, the access transistors AT thereof are formed on a semiconductor substrate 100.

More specifically, two impurity regions becoming a source region (S) and a drain region (D), respectively, of the access transistor AT (either AT1 or AT2) are formed in the semiconductor substrate 100, and a gate electrode made of poly silicon is formed on a substrate area defined between the two impurity regions through a gate insulating film. In this case, the gate electrodes compose word lines WL1 and WL2 wired in the row direction (in a direction vertical to a paper of FIG. 3), respectively, and the impurity region becoming the drain region (D) is disposed between the word lines WL1 and WL2. In addition, impurity regions each becoming the source region (S) are disposed on sides each opposite to the drain region (D) with respect to the word lines WL1 and WL2, respectively.

The drain region (D) is connected to a bit line BL composed of a first wiring layer (1M) through a bit line contact. It is noted that although not appearing in FIG. 3, the bit line BL is actually wired long in the column direction (in a transverse direction in FIG. 3).

A plug 105P and a landing pad 105 (composed of a wiring layer) are repetitively piled up one upon another on the source region (S), thereby forming a plate contact. The variable resistive element Re is formed on the plate contact.

Although which layer of a multi-layer interconnection structure the variable resistive element Re is formed in is arbitrary, in this case, the variable resistive element Re is formed in about fourth to fifth layers.

The variable resistive element Re, for example, has a film structure (lamination body) having both of an insulating film 102 and a conductor film 103 between a lower electrode 101 and an upper electrode becoming the plate PL.

A material for the insulating film 102, for example, includes SiN, $SiO_2$, $Gd_2O_3$, and the like.

A material for the conductor film 103, for example, includes a metallic film, an alloy film (such as a CuTe alloy film), and a metallic compound each of which contains therein one or more metallic element selected from the group consisting of Cu, Ag, Zr, and Al. It is noted that any other suitable metallic element other than Cu, Ag, Zr, and Al may be used when the material has a property which is easy to ionize. In addition, an element which is combined with at least one of Cu, Ag, Zr, and Al is preferably at least one element of S, Se, and Te. The conductor film 103 is formed as "a layer for supplying conductive ions."

FIG. 3 shows the two variable resistive elements Re connected to one plate PL. Here, memory layers (insulating films 102), ion supplying layers (conductor films 103), and the plates PL of the two variable resistive elements Re thus shown are composed of the same layers, respectively.

It is noted that in First Embodiment, the plate PL is composed of the conductive layer formed above the bit line BL. In this case, the bit line BL is composed of the first level wiring layer (1M), and the plate PL is composed of the fourth to fifth level wiring layers (conductive layers). However, an upper and lower relationship of the wiring layers utilized by the bit line BL and the plate PL may be reversed, or which of the wiring layers utilized by the bit line BL and the plate PL belonging to is also arbitrary.

Figure 4A:
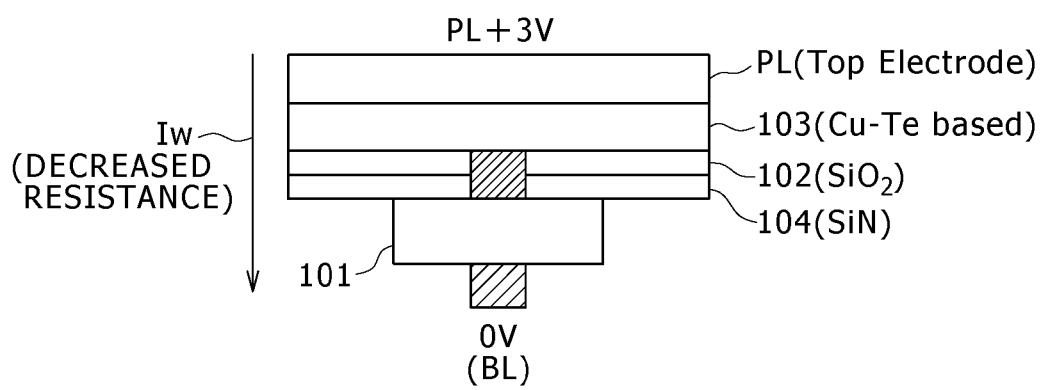
FIGS. 4A and 4B are respectively a graphical representation showing a load curve of an access transistor with a variable resistive element as a load in the case of a decreased resistance, and a graphical representation showing a load curve of the access transistor with the variable resistive element as the load in the case of an increased resistance.
Figure 4B:
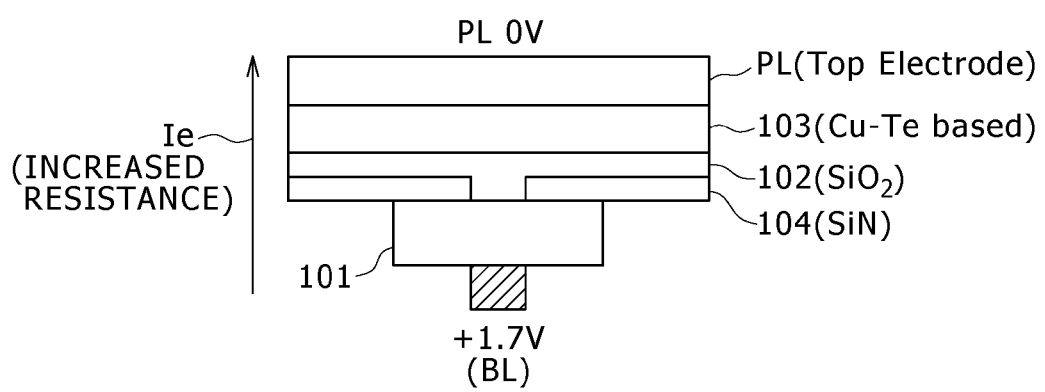

FIGS. 4A and 4B are respectively graphical representations which are obtained by adding directions of current, and examples of applied voltage values to enlarged views of the variable resistive element Re.

Also, FIGS. 4A and 4B show the case where, for example, the insulating film 102 for which an area of contact with the lower electrode 101 in an opening portion of a nitride film (SiN film) 104 is regulated, is made of $SiO_2$, and the conductor film 103 is made of a CuTe alloy based alloy compound (Cu—Te based).

In FIG. 4A, a voltage in which the insulating film 102 side is set as a negative side and the conductor film 103 side is set as a positive side is applied across the lower electrode 101 and the upper electrode (the plate PL). For example, the bit line BL is grounded at 0 V and, for example, a voltage of +3 V is applied to the plate PL.

Then, there is offered a property in which Cu, Ag, Zr or Al contained in the conductor film 103 is ionized and attracted to the negative side. As a result, these metallic conductive ions are implanted into the insulating film 102. For this reason, the insulating property of the insulating film 102 is reduced, and the insulating film 102 comes to have the conductive property along with the reduction in the insulating property. As a result, a write current Iw having a direction shown in FIG. 4A is caused to flow. This operation is referred to either as write (operation) or as set (operation).

Contrary to this, in FIG. 4B, a voltage in which the insulating film 102 side is set as the positive side and the conductor film 103 side is set as the negative side is applied across the lower electrode 101 and the upper electrode (the plate PL). For example, the plate PL is grounded at 0 V and, for example, a voltage of +1.7V is applied to the bit line BL.

Then, the conductive ions implanted into the insulating film 102 are returned back to the conductor film 103 and thus the operation state is reset to a state in which the resistance value is high before the writing operation. This operation is referred to either as erasing (operation) or as reset (operation). In the reset, an erasing current Ie having a direction shown in FIG. 4B is caused to flow.

It is noted that the set means "sufficiently implanting the conductive ions into the insulating film," and the reset means "sufficiently drawing out the conductive ions from the insulating film."

On the other hand, which of the states (either the set or the reset) the data writing state is set as, and which of the states the erasing state is set as are arbitrarily defined.

In addition, in another definition, causing the variable resistive element Re to transit from a high resistance state HRS to a low resistance state LRS is called the set, and a reverse operation is called as the reset.

In the following description, the case where the insulating property of the insulating film 102 is reduced, so that the entire resistance value of the variable resistive element Re is reduced to the sufficient level (the transition to the low resistance state LRS) is made to correspond to "the write (set)." Contrary to this, the case where the insulating property of the insulating film 102 is returned back to the original initial state, so that the entire resistance value of the variable resistive element Re is increased up to the sufficient level (returning back to the high resistance state HRS) is made to correspond to "the erasing (reset)."

Here, a direction of an arrow of a symbol in the circuit of the variable resistive element Re shown in FIG. 2A is normally identical to that of the current in the phase of the set (in the phase of the write in this case).

The set and reset described above are repetitively carried out, whereby a binary memory is realized in which the resistance value of the variable resistive element Re is reversely changed between the high resistance state and the low resistance state. In addition thereto, since data is held even when application of the voltage is stopped, the variable resistive element Re functions as a non-volatile memory.

However, the technique of the present disclosure may also be applied to a ternary or more multi-valued memory other than the binary memory.

It is noted that since in the phase of the set, actually, the resistance value of the insulating film 102 is changed depending on an amount of metallic ions contained in the insulating film 102, the insulating film 102 can be regarded as "a memory layer" in which the data is stored and held.

A memory cell is configured by using the variable resistive element Re, and a large number of memory cells are provided, thereby making it possible to configure a memory cell array of the resistance-change memory. The resistance-change memory is configured so as to include the memory cell array and a drive controlling circuit (peripheral circuit) for the memory cell array.

[Column Circuit Configuration and Operation]

Next, a column circuit configuration and an operation thereof will be described in detail with reference to FIGS. 5 and 6, respectively.

Figure 5:
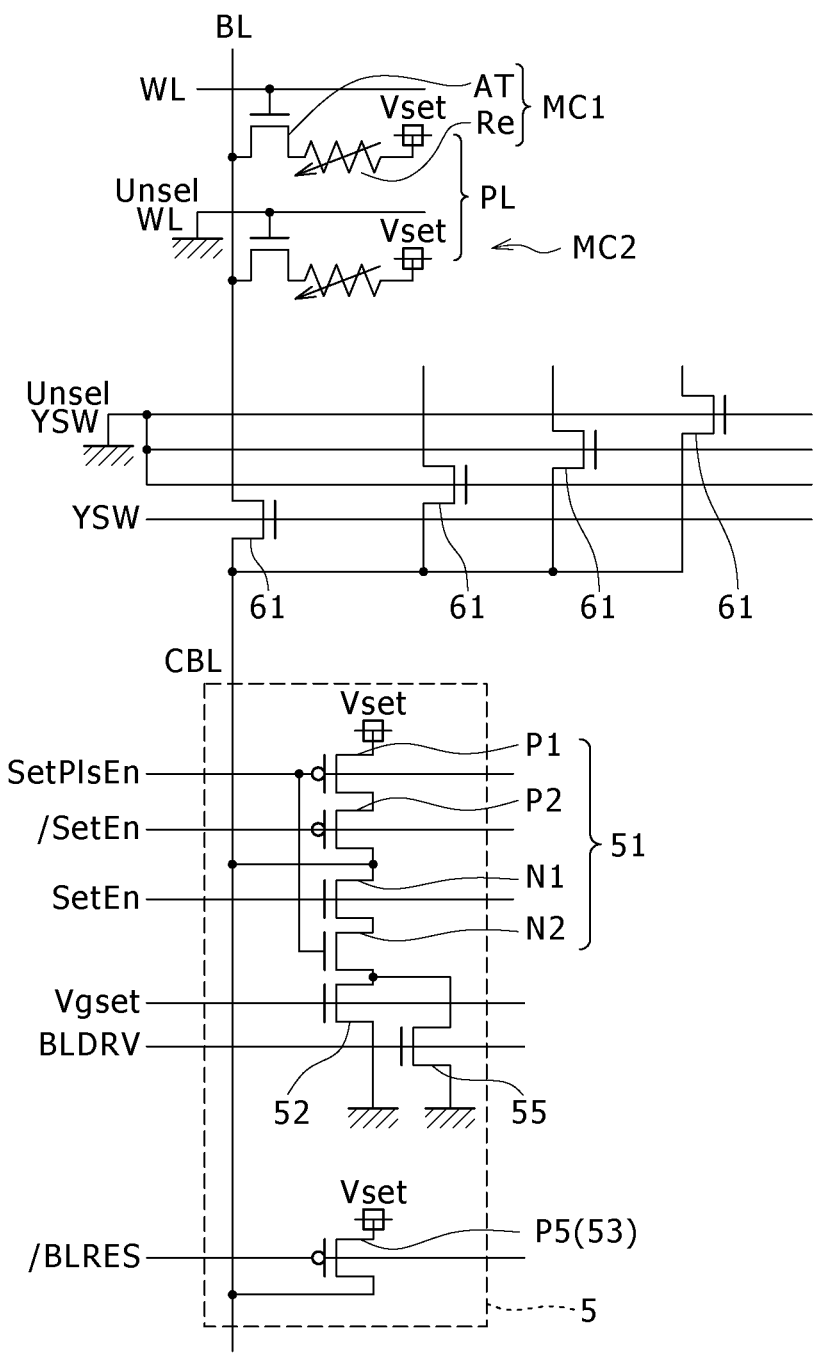
FIG. 5 is a circuit diagram showing a column circuit configuration in the resistance-change memory device according to First Embodiment of the present disclosure.

FIG. 5 shows a circuit configuration (column circuit configuration) in a column direction of the memory cell array.

Two memory cells MC1 and MC2 adjacent to each other in the column direction are shown in FIG. 5. Each of the memory cells MC1 and MC2 includes the variable resistive element Re connected to the plate PL, and the access transistor AT connected between the variable resistive element Re and the bit line BL similarly to the case of FIGS. 2A and 2B.

A word line driving pulse (designated by the same reference symbol WL as that of a word line WL) is applied to the word line WL to select the memory cell MC1. On the other hand, a word line of the memory cell MC2 is an un-selection word line (Unsel WL) and is grounded in this case.

It is noted that in addition thereto, a large number of memory cells are connected between the bit line BL and the plate PL. Although in FIG. 5, illustrations of other memory cells are omitted, in this case, each of other memory cells whose illustrations are omitted is held in the un-selection state in which the word line thereof is grounded similarly to the case of the memory cell MC2.

Plural memory columns having the same configuration are repetitively disposed in the row direction with the configuration shown in FIG. 5 as a basic unit, thereby configuring the memory cell array.

The column circuit configuration discloses a configuration in which plural common line pairs hold a voltage driver 51 (voltage driving portion), an element current controlling portion 52 for the bit line, and a set driver 5 (drive controlling circuit) having an initial current driving portion 53 in common.

For this reason, there is a necessary configuration with which any one of the common line pairs for common ownership is selected to be connected to the drive controlling circuit.

More specifically, a selecting transistor 61 for the bit line BL is provided every memory column. The selecting transistors 61 are provided by the number of memory columns holding the same drive controlling circuit in common. FIG. 5 shows the four selecting transistors 61.

Since each of the four selecting transistors 61 shown in FIG. 5 has an NMOS configuration, a positive column selection pulse YSW is applied to a gate terminal thereof.

On the other hand, gate terminals of other selecting transistors 61 each held in the un-selection state are grounded.

A common wiring connected to the bit line BL by the selecting transistor 61 is called "a common bit line CBL."

The set driver 5 (drive controlling circuit) includes the voltage driver 51 (voltage driving portion), the element current controlling portion 52, the reset portion 53, and the initial current driving portion 55 as the circuits or elements connected to the common bit line CBL.

It is noted that the word "reset" in the reset portion 53 does not mean the erasing or the resistance increasing operation described above, but simply means an un-operation state (so-called standby). Hereinafter, the word "reset" is used as the meaning of the standby in some cases.

The voltage driver 51 includes two PMOS transistors P1 and P2, and two NMOS transistors N1 and N2.

A drain terminal common to the PMOS transistor P2 and the NMOS transistor N1 is connected to a common bit line CBL. The PMOS transistor P1 is connected between a source terminal of the PMOS transistor P2 and a supply line for a positive set voltage Vset. Also, the NMOS transistor N2 is connected between a source terminal of the NMOS transistor N1 and a supply line for the grounding electric potential.

A set enable signal SetEn is applied to a gate terminal of the NMOS transistor N1, and an inversed signal (/SetEn) of set enable is applied to a gate terminal of the PMOS transistor P2.

A set pulse enable signal SetPlsEn is applied to each of the gate terminals of the PMOS transistor P1 and the NMOS transistor N2.

The element current controlling portion 52 includes a single NMOS transistor N3 which is connected in series between the common bit line CBL and a supply line for a reference voltage (for example, the grounding electric potential) through the two NMOS transistors N1 and N2.

A set gate voltage Vgset for current control is applied to a gate terminal of the NMOS transistor N3.

The characteristic configuration in First Embodiment is that an NMOS transistor N4 composing the initial current driving portion 55 is provided in parallel with the NMOS transistor N3 composing the element current controlling portion 52. The NMOS transistor N4 is driven by using a bit line drive signal BLDRV.

Here, the NMOS transistor N3 corresponds to an example of "a second transistor (TR)," and the NMOS transistor N4 corresponds to an example of "a first transistor (TR)."

The ensuring of the controllability of the bit current, and the contribution to the high-speed operation through the switching of the first and second transistors will be described in an operation to be described later.

The reset portion 53 includes a PMOS transistor P5 whose source terminal is connected to the supply line for the set voltage Vset, and whose drain terminal is connected to the common bit line CBL. A gate terminal of the PMOS transistor P5 is controlled in accordance with a reset signal /BLRES.

Before the operation shown in FIG. 5 is described with reference to FIGS. 6A to 6I, a basis of the set operation is described with reference to FIGS. 7A and 7B.

The set operation (resistance decreasing operation) is started by reducing an electric potential (BL electric potential) of the bit line BL from a state in which the positive set voltage Vset is applied across the bit line BL and the plate PL. At this time, a power source voltage Vdd is applied to the word line WL. For this reason, the element current (the write current Iw in this case) is caused to flow in a direction indicated by an arrow shown in FIG. 7A. It is noted that hereinafter, the write current Iw is referred to as "a set (Set) current" as well.

Figure 7A:
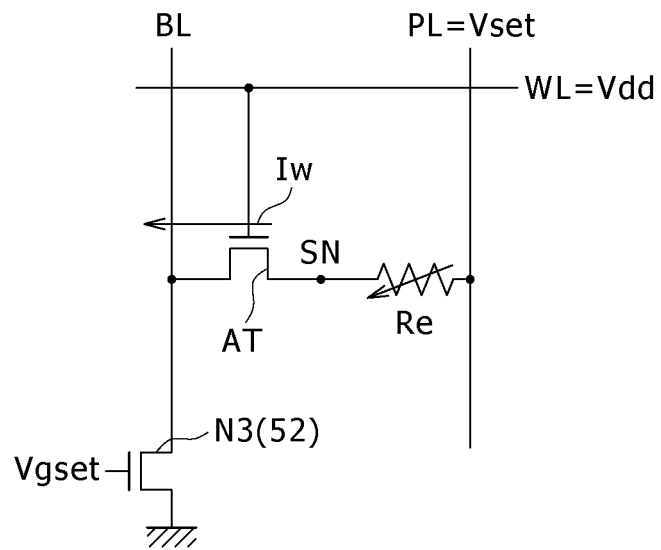
FIGS. 7A and 7B are respectively a circuit diagram and a graphical representation explaining a set operation.
Figure 7B:
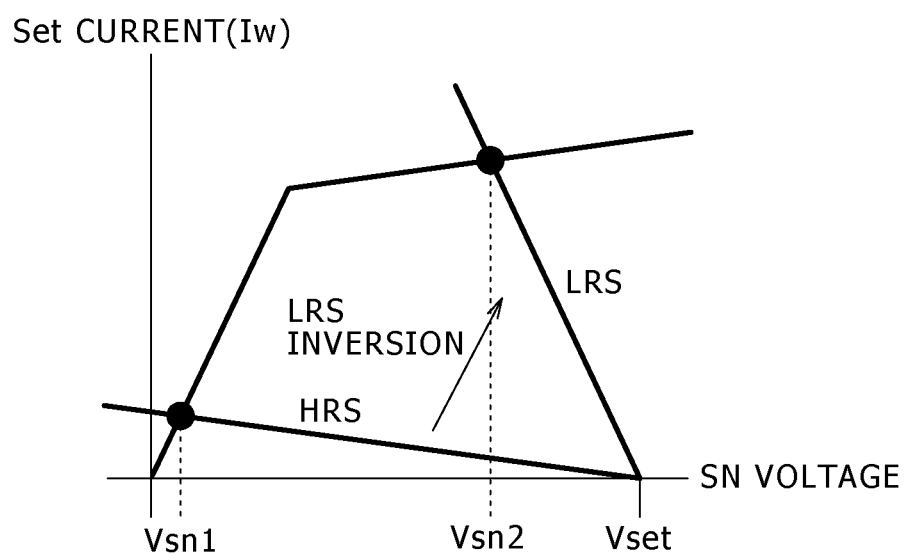

FIG. 7B is a graphical representation in which a load straight line by the variable resistive element Re is superposed on drain voltage-drain current characteristics (saturated characteristics) of the access transistor AT in a state in which a channel is opened by applying a power source voltage to the word line.

As shown in FIG. 7A, we shall refer a node between the variable resistive element Re and the access transistor AT as a memory node SN. An axis of abscissa in FIG. 7B represents an SN voltage (a drain voltage of the access transistor AT) with the electric potential of the bit line held in the grounding state as a reference. In addition, an axis of ordinate in FIG. 7B represents the Set current (the drain current in the access transistor AT).

Before the set operation is carried out, since the voltage applied to the word line WL, for example, is the power source voltage Vdd, the memory node SN and the bit line BL are short-circuited, and thus the SN electric potential and the electric potential of the bit line BL (hereinafter referred to as "a BL electric potential") become approximately equal to each other. In addition, at this time, since the electric potential of the bit line BL is held at the set voltage Vset, only a very small voltage is applied to the variable resistive element Re, and thus the variable resistive element Re is held approximately in a stress free state. Also, a source-to-drain voltage of the access transistor AT is also very small, and thus the access transistor AT is operated either in a non-saturated region or does not cause a current to flow.

The set operation is started in this state, and the electric potential of the bit line BL is caused to drop to the reference electric potential, for example, GND. Since in a phase of start of the set operation, the variable resistive element Re is held in the high resistance state HRS, a slope of the load straight line is small. For a while from the start of the set operation, a voltage at an operating point (first memory node voltage Vsn1) is very small. Therefore, a large voltage (Vset−Vsn1) is applied to the variable resistive element Re, and thus the variable resistive element Re is exposed to a voltage stress. Here, since the BL electric potential is equal to (Vset−Iset× Rcell) and thus a cell resistance Rcell is very large, the BL electric potential takes a value close to a reference voltage Vss (GND=0 V in this case). Therefore, the voltage applied to the variable resistive element Re is a very large voltage close to the set voltage Vset.

When this large stress is applied to the variable resistive element Re for some degree of time, the variable resistive element Re transits from the high resistance state HRS to the low resistance state LRS (LRS inversion). When the LRS inversion is caused, the slope of the load straight line abruptly becomes large, and the operating point enters the saturated region. The voltage at the operating point transits from the small first memory node voltage Vsn1 to a second memory node voltage Vsn2. After the LRS inversion, the SN electric potential becomes equal to the voltage Vsn2 (=Iset×RLRS) determined by a product of the Set current Iset (the element current after the inversion) and an element resistance value (RLRS) in the phase of the LRS, thereby providing a state in which a voltage (Vset−Vsn2) is applied to the variable resistive element Re.

In the current driving system for the bit line, as shown in FIG. 7A, the NMOS transistor N3 (the element current controlling portion 52) to which a set gate voltage Vgset is applied is substantially interposed between the bit line BL and the grounding electric potential (refer to FIG. 5).

Now, if the case where there is no NMOS transistor N3 is supposed, the bit line BL is directly connected to the grounding electric potential to become a state in which the electric potential is fixed. In this case, when there is a dispersion in the characteristics of the memory elements (the variable resistive elements Re), the operating point is also changed. As a result, the Set current values are dispersed.

On the other hand, in the current driving system for the bit line, an electric potential at a drain terminal of the NMOS transistor N3 (the electric potential of the bit line) is changed in such a way that the NMOS transistor N3 makes a current caused to flow through the bit line (in a word, either the write current Iw or the Set current) constant. For this reason, even when there is the dispersion in the element characteristics, the Set current becomes constant in the saturated region.

After the LRS inversion, the electric potential of the bit line BL is returned back to the original set voltage Vset, and the set operation concerned is ended.

An example in which in the set operation described above, the BL electric potential is reduced through the current switching will now be described from a viewpoint of a circuit operation with reference to timing charts shown in FIGS. 6A to 6I. It is noted that in this operation description, reference numerals or symbols of the circuit elements used in FIG. 5 are suitably quoted.

The operation is held in a standby state until a time t0 shown in FIGS. 6A to 6I. At this time, as shown in FIGS. 6A to 6F, the various kinds of (pulse) signals used in FIG. 5 takes values of High (H) or Low (L), respectively.

Specifically, when WL=L, the access transistor AT is held in an OFF state, and when YSW=L, the selecting transistor 61 is turned OFF. As a result, the bit line BL is disconnected from the common bit line CBL. Since (/BLRES)=L, the electric potential of the common bit line CBL is set to the set voltage Vset by the PMOS transistor P5 held in the ON state. In addition, since SetEn=L, the voltage driving by the voltage driver 51 becomes non-active. In addition, although the bit line drive signal BLDRV is at an active L level, the NMOS transistor N1 is turned OFF because of SetEn=L. For this reason, the NMOS transistor N4 composing the initial current driving portion 55 is not operated.

At this time, a set gate voltage Vgset shown in FIG. 6G is set at a certain voltage by a control circuit (not shown in FIG. 5). However, Since SetEn=L, the NMOS transistor N4 is turned OFF, and thus a bit line current control by the NMOS transistor N3 is not carried out (is invalid).

As shown in FIGS. 6H and 6I, since in the phase of the standby, each of the bit line BL, the common bit line CBL, and the like takes the set voltage Vset because of SetEn=L, no element current is caused to flow.

At a time t0, the various signals shown in FIGS. 6A to 6D are inversed.

As a result, the standby state is released, and the column switch is made to conduct, so that the bit line BL is connected to the common bit line CBL.

The access transistor AT becomes conductable.

In addition, in the voltage driver 51, each of the NMOS transistor N1 and the PMOS transistor P2 can be turned ON. However, since as shown in FIG. 6E, SetPlsEn=L is maintained, the voltage driving for the plate PL by the voltage driver 51 is not yet carried out.

In addition, in the element current controlling portion 51, the operation enters a valid period of time for which the bit line current control can be carried out by the NMOS transistor N3.

As described above, by the signal inversion at the time t0, the preliminary preparation is ready for the set operation.

The set operation (resistance decreasing operation) is started at a time t1 following the time t0. At this time, each of the electric potentials of the bit line BL and the common bit line CBL is started to drop to the grounding electric potential, thereby starting the set operation.

The feature of First Embodiment is that the start of the set operation is driven by the NMOS transistor N4 which has the large driving force and which causes the larger first current I1 to flow, and the first current I1 is switched over to the smaller second current I2 in midstream.

Specifically, when at the time t1, the set pulse enable signal SetPlsEn rises, since both of the NMOS transistors N1 and N2 are turned ON, the NMOS transistor N4 (the initial current driving portion 55) is also turned ON. As a result, as shown in FIG. 6H, each of the electric potentials of the common bit line CBL and the bit line BL is rapidly reduced.

At a time t3 at which the electric potential is sufficiently reduced, in order to switch the current to be caused to flow from the first current I1 over to the second current I2, the transistor to be turned ON is switched from the NMOS transistor N4 over to the NMOS transistor N3. This switching is carried out by the falling of the bit line drive signal BLDRV.

By the two stages of current driving, the speed-up of the set operation is realized as follows.

FIG. 6H shows the case where the two stages of current driving are not carried out, in a word, the initial current driving portion 55 is not provided as indicated by a broken line. In this case, since only the NMOS transistor N3 which is gate-biased and may not rapidly cause the current to flow because of current control is driven, only the gradual electric potential reduction is obtained.

On the other hand, in First Embodiment, the LRS transition is accelerated all the more because the rapid electric potential reduction is obtained by the two stages of switching of I1→I2. As a result, the set operating time is shortened.

Even when such a set operation is started, as shown in the load curve of FIG. 7B, the memory cell is held in the high resistance state HRS. Therefore, the set driver 5 is operated in the linear region, and the BL electric potential is equal to "(Vset−Iset×RHRS)≈Vss (GND)." Therefore, the variable resistive element Re is exposed to the voltage stress close to Vset, and is LRS-inverted a little later. This is as previously been described with reference to FIGS. 7A and 7B.

In FIG. 6H, a period of time ranging from the time t1 to the time t3 represents a stress application time until the LRS inversion is caused (effective write time). In such a resistance-change memory element, for example, the memory element having the structure shown in FIGS. 4A and 4B, the application of a certain high level of the voltage results in that the metallic ions begin to be moved and thus the transition of the resistance state is caused.

When the LRS inversion is caused at the time t3, the BL electric potential is controlled in accordance with the bit line current control by the NMOS transistor N3 which the element current controlling portion 52 has in such a way that the bit line current, that is, the element current (Set current) becomes constant. The BL electric potential after completion of the control, as shown in FIG. 6H, takes a value which is larger than the grounding electric potential (GND), and is smaller than the set voltage Vset. This value is suitably changed every memory cell in such a way that even when there is the dispersion in the characteristics of the variable resistive elements Re, the Set current Iset becomes constant. In addition, the Set current Iset can be controlled so as to have a desired value by the set gate voltage Vgset given to the NMOS transistor N3.

Here, as shown in FIG. 6H, the voltage (Iset×RLRS) is applied to the variable resistive element Re. At this time, as shown in FIGS. 4A and 4B, the resistance value RLRS of the LRS can be controlled in accordance with a value of the Set current Iset. This control is the bit line current control in the technique disclosed herein, and thus the resistance value RLRS of the desired LRS is obtained in accordance with what kind of value the set gate voltage Vgset given to the NMOS transistor N3 shown in FIG. 5 is made to become.

Therefore, the narrow LRS resistance distribution can be realized in a large number of memory cells. In addition, the multi-valued memory having a multi-bit larger than 2 bits becomes easy to realize.

At a subsequent time t4, the level of the set pulse enable signal SetPlsEn is returned back to the L level. The BL electric potential is made to rise up to the electric potential (Vset) of the plate PL, thereby completing the set operation (resistance decreasing operation).

When all of the signals are returned back to the initial logics at a time t5, the operation becomes the standby state again.

[Entire Block Configuration of Memory]

Figure 8:
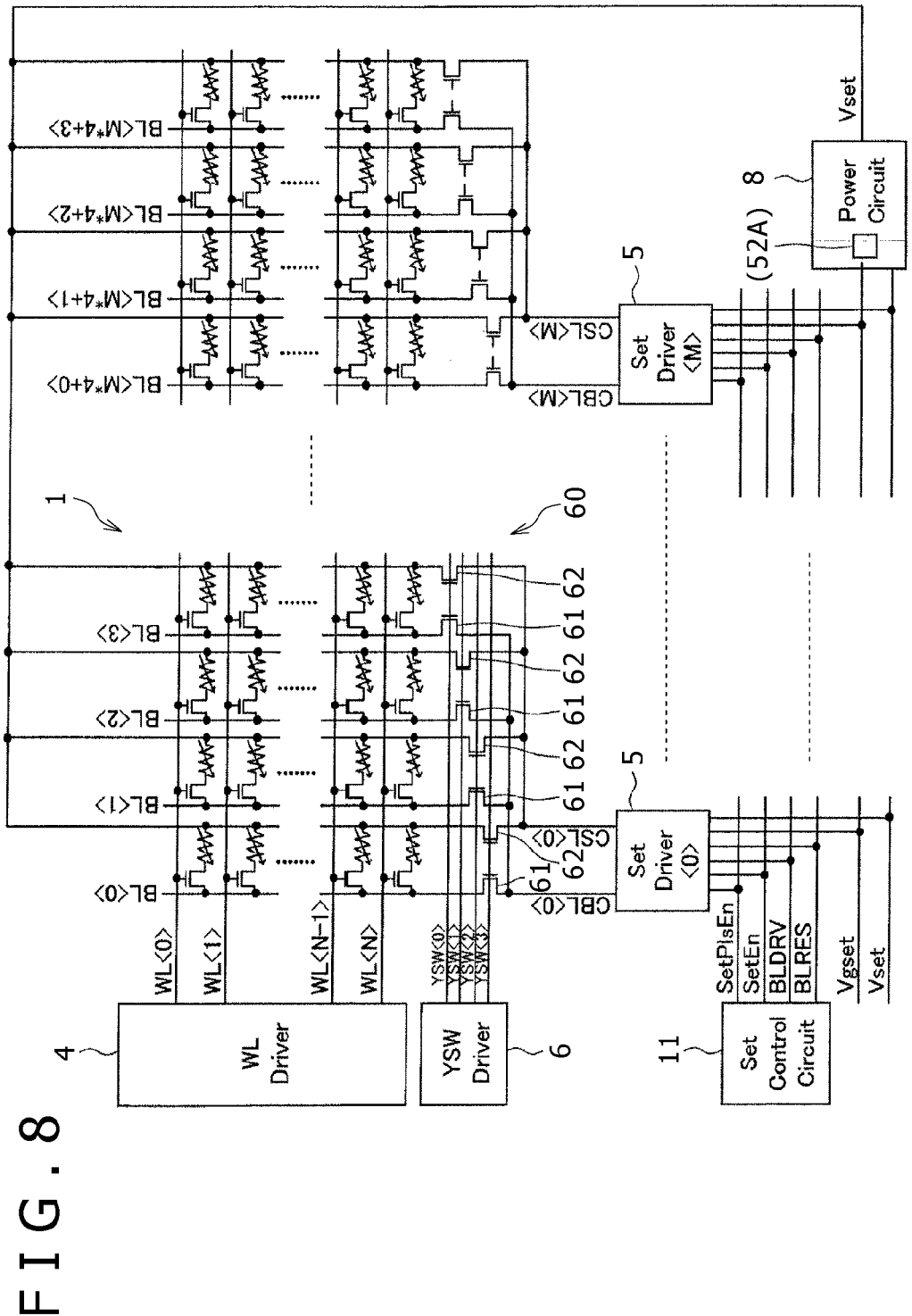
FIG. 8 is a circuit diagram, partly in block, showing an entire configuration of a resistance-change memory device.

FIG. 8 shows an entire block configuration of the resistance-change memory device. Also, FIG. 8 is a circuit diagram, partly in block, showing a configuration of a memory cell array 1 in which a large number of 1T-1R type memory cells MC are disposed in a matrix, and a main portion of a peripheral circuit of the memory cell array 1.

The memory illustrated adopts a system in which one set driver 5, and a common line pair (CBL and CSL) to which the set driver 5 is connected are held in common every four memory cell columns. The control for the connection between the four memory cell columns and one common line pair (CBL and CSL) is carried out in a YSW portion 60 having four pairs of selecting transistors 61 and 62. The connection control is the ¼ MUX switching, and thus only one pair (BL and SL) which is connected to the common line pair (CBL and CSL) is selected from four pairs (BL and SL).

There is provided a YSW driver 6 for generating selection signals YSW <0> to YSW <3> for four pairs of selecting transistors 61 and 62 provided every YSW portion 60.

In addition, there is provided a WL driver 4 for selecting any one of, for example, (N+1) word lines WL<0> to WL<N> provided in the memory cell array 1 to drive the word line thus selected with, for example, the power source voltage Vdd.

In this case, adopting the ¼ MUX switching system, the disposition space of the set drivers 5 has room all the more because the set drivers 5 the number of which is ¼ of the number of memory columns are provided. Thus, since the efficient disposition is provided, the area is reduced.

Each of the set drivers 5 has the circuit configuration as shown in FIG. 5, and thus the necessary four kinds of signals are supplied thereto from a set control circuit 11 within the memory. The four kinds of signals are the set pulse enable signal SetPlsEn, the set enable signal SetEn, the bit line drive signal BLDRV, and the reset signal BLRES. However, when the first two inverted signals are included, the six kinds of signals in total are generated in the set control circuit 11.

There is provided a power source circuit (Power Circuit) 8 for generating the set voltage Vset and the set gate voltage Vgset.

Here, the set control circuit 11 either may be realized as a part of a general control circuit (not shown) for generally controlling all of the blocks of the memory device, or may be disposed as a discrete control circuit which is controlled by the general control circuit.

In addition, the power source circuit 8 variably controls the value of the set gate voltage Vgset in accordance with the control by either the general control circuit (not shown) or the set control circuit 11. As a result, there is realized a memory which can change the Set current in such a way that the desired LSR resistance value is obtained.

2. Second Embodiment

Figure 9:
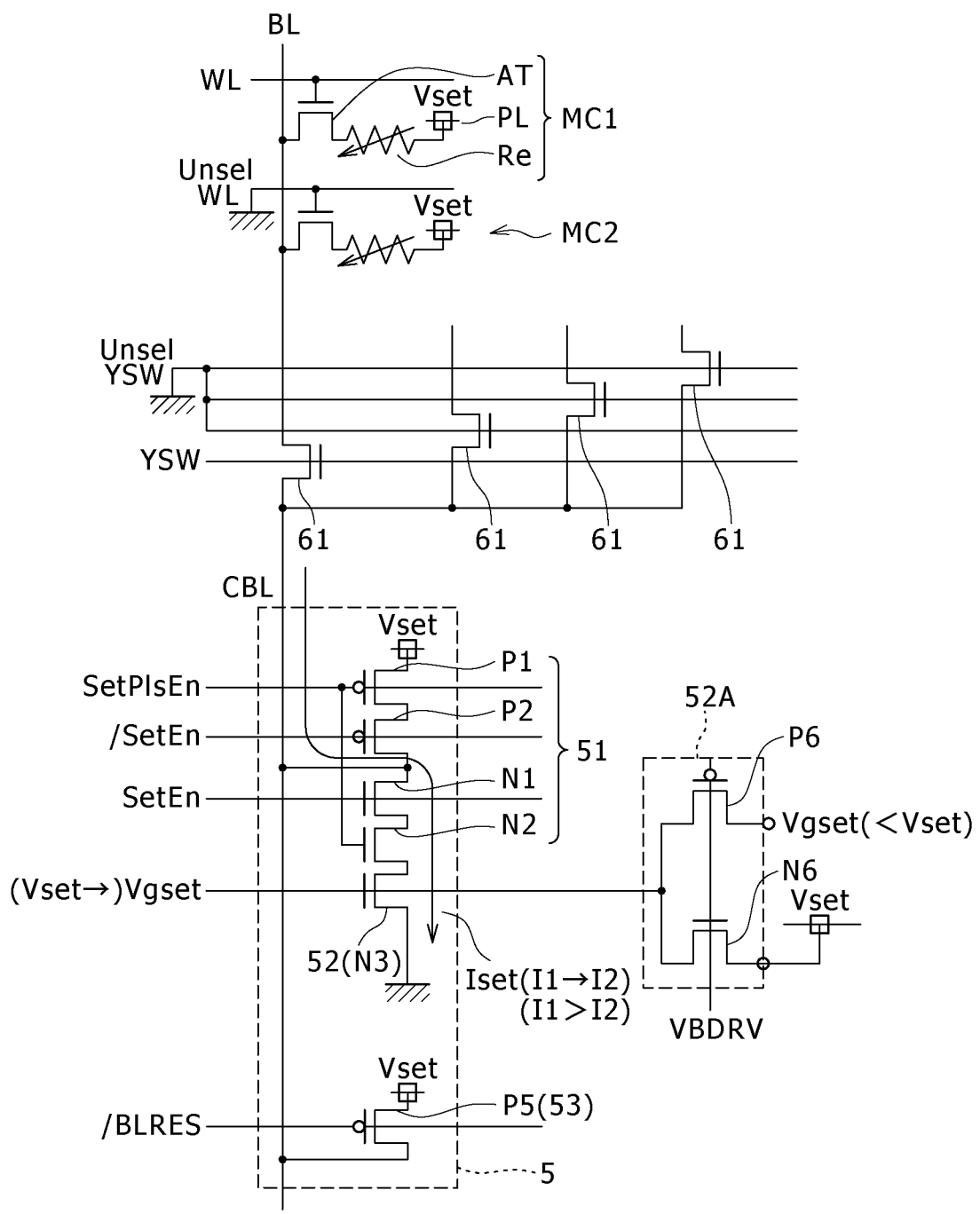
FIG. 9 is a circuit diagram showing a column circuit configuration in a resistance-change memory device according to Second Embodiment of the present disclosure.

FIG. 9 shows a circuit diagram of a column circuit configuration in a resistance-change memory device according to Second Embodiment of the present disclosure.

When the configuration shown in FIG. 9 is compared with that shown in FIG. 5, it is understood that the initial current driving portion 55 (N3) is omitted, and a control circuit 52A is added instead. The control circuit 52A composes a part of the element current controlling portion 52. However, in terms of the disposition, the control circuit 52A, as shown in FIG. 8, is provided within the power source circuit 8.

Second Embodiment discloses a configuration in which the gate bias of the element current controlling portion 52 is controlled in such a way that in the early stages of the set current, the larger first current I1 is caused to flow, and subsequently, the gate bias concerned is switched in such a way that the second current I2 smaller than the first current I1 is caused to flow.

Specifically, the control circuit 52A includes an NMOS transistor N6 and a PMOS transistor P6 which are connected in parallel with the gate terminal of the NMOS transistor N3. A drain terminal of the NMOS transistor N6 is connected to a supply line for the set voltage Vset. The PMOS transistor P6 has an input terminal for the set gate voltage Vgset. The set gate voltage Vgset is generated either in the set control circuit 11 shown in FIG. 8 or in a general control circuit (not shown) to be supplied to the PMOS transistor P6.

Both of the NMOS transistor N6 and the PMOS transistor P6 are differentially controlled in accordance with the bit line drive signal BLDRV. Hereinafter, although the reduction of the BL electric potential by the differential control will be described, the operation waveform charts are identical to those shown in FIGS. 6A to 6I, and thus the operation waveform charts shown in FIGS. 6A to 6I are applied to Second Embodiment as they are.

In the early stages of start of the set operation, the NMOS transistor N6 is held in the ON state, and the PMOS transistor P6 is held in the OFF state. Therefore, the NMOS transistor N3 composing the element current controlling portion 52 is driven in accordance with the larger set voltage Vset. Therefore, the BL electric potential is rapidly reduced by the large current driving force. When the sufficient reduction of the electric potential is obtained, the inversion of the bit line driving signal BLDRV results in that the NMOS transistor N6 is turned OFF, and the PMOS transistor P6 is turned ON. As a result, after that, the bit line current control is carried out in accordance with the set gate voltage Vgset having the smaller voltage value.

3. Third Embodiment

Figure 10:
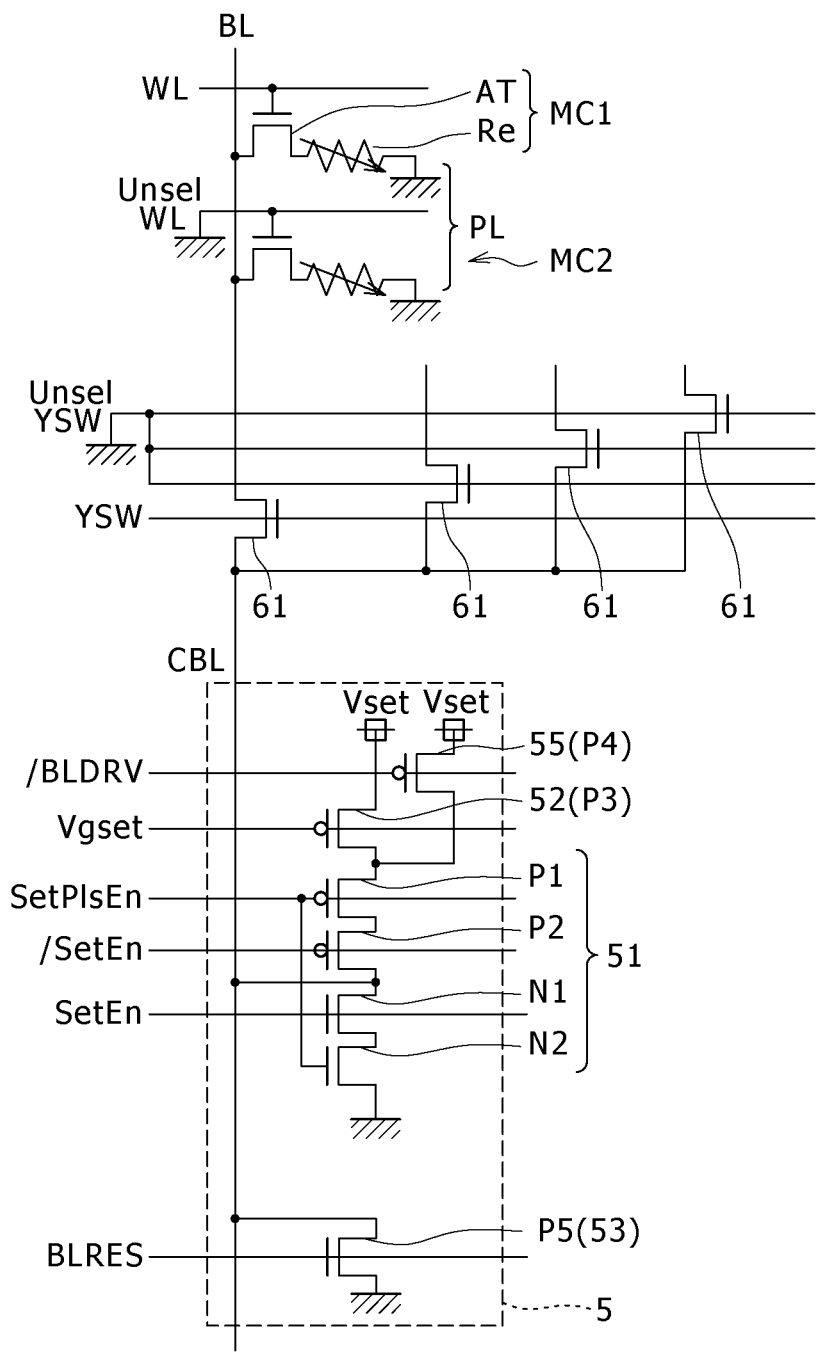
FIG. 10 is a circuit diagram showing a column circuit configuration in a resistance-change memory device according to Third Embodiment of the present disclosure.

FIG. 10 shows a circuit diagram of a column circuit configuration in a resistance-change memory device according to Third Embodiment of the present disclosure. FIGS. 11A to 11I respectively show operation waveform charts (timing charts).

In First Embodiment described above, the BL electric potential is reduced from the higher electric potential to the lower electric potential, thereby carrying out the set operation. On the other hand, in Third Embodiment, the BL electric potential is increased from the lower electric potential to the higher electric potential, thereby carrying out the set operation.

Although with the change as described above, as shown in FIG. 10, a transistor P3 composing the element current controlling portion 52 is disposed on the power source side (the set voltage Vset side), and a transistor P4 composing the initial current driving portion 55 is also provided in parallel with the transistor P3. These transistors P3 and P4 are obtained by changing the channel conductivity type from the N-channel to the P-channel. In addition, the active logics of the control signals are inversed.

In addition thereto, the electric potential of the plate PL is held at the grounding electric potential.

In this case, the operation waveforms shown in FIGS. 11A to 11I are offered. It is noted that the waveforms shown in FIGS. 11A and 11E are inversed from those shown in FIGS. 6A and 6E, respectively.

In addition thereto, the voltage waveform chart shown in FIG. 11H is different from that shown in FIG. 6H. In this case, the BL electric potential is increased from the low L level to the high H level, thereby starting the set operation. In addition, the operation for finally retuning the operation state back to the standby state is carried out by returning the electric potential back to the low L level.

The two stages of the current control in the early stages of the set operation are as described in First Embodiment. As a result, the high-speed operation can be carried out while the high current controllability is maintained.

It is noted that carrying out such a set operation by increasing the BL electric potential can also be applied to Third Embodiment. In addition, the circuit diagram, partly in block, of FIG. 8 can be applied to Third Embodiment as it is.

4. Fourth Embodiment

Figure 12:
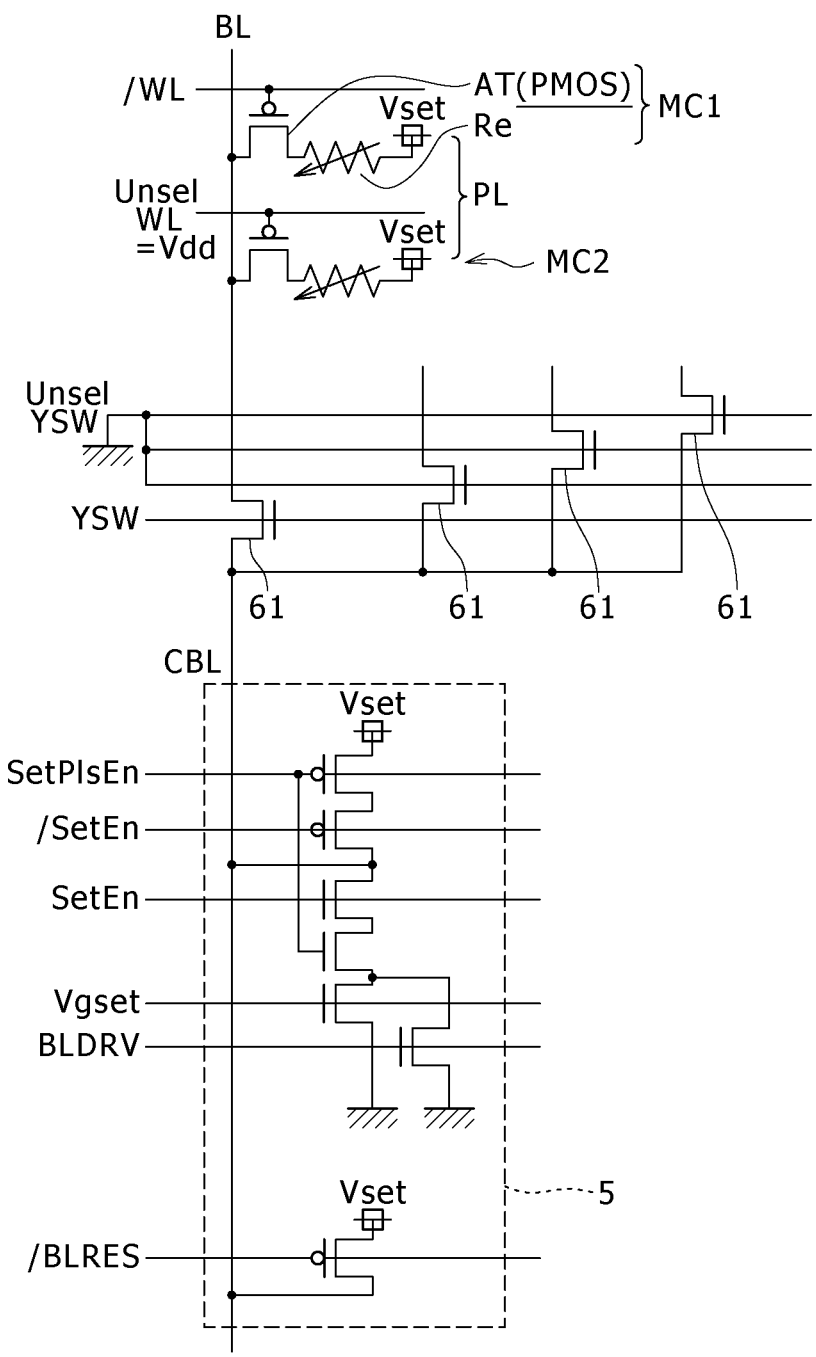
FIG. 12 is a circuit diagram showing a column circuit configuration in a resistance-change memory device according to Fourth Embodiment of the present disclosure.

FIG. 12 shows a circuit diagram of a column circuit configuration in a resistance-change memory device according to Fourth Embodiment of the present disclosure.

In the configuration shown in FIG. 12, the access transistor AT of each of the memory cells MC is changed from the NMOS transistor of each of First to Third Embodiments over to a PMOS transistor. Along with this change, the active logic of the control signals for the word line WL is desired to be inversed from that in each of the cases of FIGS. 6A and 11A. The circuit diagram, partly in block, of FIG. 8 is applied as it is.

Other circuit configurations and operation waveform charts are common to First to Third Embodiments.

As described above, with the technique disclosed herein, the resistance decreasing operation (set operation) is started in accordance with the change in the electric potential of the bit line, and during the resistance decreasing operation, the element current (Iset) caused to flow through the element memory (Re) is controlled on the side of the bit line. Also, in the early stages of the start of the set operation, the high-speed change in the BL electric potential is carried out with the first current. Then, the first current is switched over to the smaller second current, and the bit line current control is carried out with the second current. This control operation is carried out in the drive controlling circuit including at least the set driver 5. The drive controlling circuit may conceptually include the set control circuit 11 (or the general control circuit), the power source circuit 8, and the like.

A concrete configuration of the drive controlling circuit may include the initial current driving portion 55 (the first transistor (N4)), and the element current controlling portion 52 (the second transistor (N3)). In this case, as described above, the initial current driving portion 55 is connected to the bit line BL and causes the first current I1 to flow. Also, the element current controlling portion 52 is connected in parallel with the initial current driving portion 55, causes the second current I2 to flow, and carries out the bit line current driving. In this case, the first and second transistors (N4 and N3) may be differentially controlled to switch the first current I1 and the second current I2 over to each other.

The driving ability of the first transistor (N4) is larger than that of the second transistor (N3).

Or, the first transistor (N4) is driven by a voltage having a larger crest value (for example, Vset) than that (for example, Vgset) of the control pulse when the control pulse is inputted to the second transistor (N3), thereby controlling the element current.

Any of a configuration of carrying out the set operation by reducing the BL electric potential, or a configuration of carrying out the set operation by increasing the BL electric potential may be adopted.

Or, it is also possible to carry out the control in which the initial current driving portion 55 (N4) is omitted, even the change in the voltage of the gate terminal of the NMOS transistor N3 of the element current controlling portion 52 is firstly driven by the large current driving force, and the large current driving force is then switched over to the smaller driving force suitable for the BL current control. That control may be carried out as a part of either the set control circuit 11 or the general control circuit.

5. Modified Changes

The above embodiments have been mainly described based on the case where "the voltage supplying member" for supplying the voltage to the memory element together with the bit line is the plate PL. However, the voltage supplying member includes a three-wire system example in which the voltage supplying member, for example, is separated every memory column as with the source lines or the like. The circuit diagram, partly in block, of FIG. 8 shows the configuration in which the source lines SL are separately provided to be capable of being individually controlled, or can also be collectively voltage-driven as with the plate.

In general, in the three-wire system, it is enough for the voltage change in the phase of the start of the resistance decreasing operation to be made with the separated wirings (the source lines SL). However, this does not become the reason in which the technique, disclosed herein, for carrying out the operation start and the current control on the side of the same bit line BL is excluded from simultaneously carrying out the voltage control and the current control with the bit line(s) in the three-wire system by that fact. Therefore, it is possible to apply the technique disclosed herein to the three-wire system.

The resistance-change memory device according to the technique of the present disclosure, for example, is suitable for one of the type whose structure is shown in FIGS. 4A and 4B and which changes the resistance value by the movement of the conductive ions. However, the technique of the present disclosure can be generally applied to any other suitable resistance-change memory device such as one of a type using oxidation and reduction of an insulating layer.

It should be understood by those skilled in the art that various modifications, combinations, sub-combinations and alterations may occur depending on design requirements and other factors insofar as they are within the scope of the appended claims or the equivalents thereof.

The present disclosure contains subject matter related to that disclosed in Japanese Priority Patent Application JP 2011-132576 filed in the Japan Patent Office on Jun. 14, 2011, the entire content of which is hereby incorporated by reference.

What is claimed is:

1. A resistance-change memory device comprising:
    a bit line;
    a voltage supplying layer;
    a memory element connected between said bit line and said voltage supplying layer, a resistance value of said memory element being changed in accordance with an applied voltage; and
    a drive controlling circuit causing a first current to flow through said bit line and causing a second current smaller than the first current to flow through said bit line, thereby controlling a resistance decreasing operation in which said memory element is made to transit from a high resistance state to a low resistance state by using the second current,
    wherein said drive controlling circuit includes
        (a) an initial current driving portion configured to be connected to said bit line and cause the first current to flow,
        (b) an element current controlling portion configured to be connected in parallel with said initial current driving portion for said bit line and control the second current, and
        (c) said initial current driving portion and said element current controlling portion are controlled, thereby switching the current caused to flow through said bit line from the first current to the second current.

2. The resistance-change memory device according to claim 1, wherein:
    said initial current driving portion has a first transistor connected between a supply line for a reference voltage and said bit line, and
    said element current controlling portion has a second transistor connected between said supply line for the reference voltage and said bit line.

3. The resistance-change memory device according to claim 2, wherein a driving ability of said first transistor is larger than that of said second transistor.

4. The resistance-change memory device according to claim 2, wherein said first transistor is driven by a voltage having a larger crest value than that of a control pulse when the control pulse is input into said second transistor, thereby controlling an element current.

5. The resistance-change memory device according to claim 2, wherein said drive controlling circuit includes:
    a third transistor initially setting an electric potential of said bit line to the same electric potential as that of said voltage supplying line;
    a fourth transistor which is reversely driven by said third transistor to disconnect said first and second transistors from said bit line during the initial setting, and connecting said first and second transistors to said bit line after the initial setting; and
    a control circuit controlling conduction and non-conduction of said first, second, third, and fourth transistors.

6. The resistance-change memory device according to claim 5, wherein:
    each of said first and second transistors is an N-channel transistor connected in parallel between a supply line for the reference voltage and said fourth transistor,
    a voltage for initial setting for said bit line is a positive voltage higher than the reference voltage,
    said third transistor is a P-channel transistor, and
    said fourth transistor is an N-channel transistor which is controlled in accordance with the same signal as that for said third transistor.

7. The resistance-change memory device according to claim 5, wherein:
    each of said first and second transistors is a P-channel transistor connected in parallel between a supply line having a higher positive voltage than the reference voltage and said fourth transistor,
    a voltage for initial setting for said bit line is the reference voltage,
    said third transistor is an N-channel transistor, and
    said fourth transistor is a P-channel transistor which is controlled in accordance with the same signal as that for said third transistor.

8. A resistance-change memory device comprising:
    a bit line;
    a voltage supplying layer;
    a memory element connected between said bit line and said voltage supplying layer, a resistance value of said memory element being changed in accordance with an applied voltage; and
    a drive controlling circuit causing a first current to flow through said bit line and causing a second current smaller than the first current to flow through said bit line, thereby controlling a resistance decreasing operation in which said memory element is made to transit from a high resistance state to a low resistance state by using the second current,
    wherein said drive controlling circuit includes
        (a) a current controlling transistor connected to said bit line and causing either the first current or the second current to flow; and
        (b) a control circuit controlling an electric potential at a control node of said current controlling transistor, thereby switching a current caused to flow by said current controlling transistor from the first current to the second current.

9. A method of operating a resistance-change memory device, comprising:
    connecting an initial current driving portion a bit line and cause the first current to flow and causing a first current to flow through said bit line during a resistance decreasing operation in which a memory element which is connected between said bit line and a voltage supplying layer and whose resistance value is changed in accordance with an applied voltage is made to transit from a high resistance state to a low resistance state;
    connecting an element current controlling portion in parallel with said initial current driving portion for said bit line and controlling the application of a second current smaller than the first current to flow through said bit line, thereby controlling the resistance decreasing operation of said memory element; and controlling said initial current driving portion and said element current controlling portion to switch the current caused to flow through said bit line from the first current to the second current.

* * * * *